(12) United States Patent
Kwak et al.

(10) Patent No.: US 10,936,409 B2
(45) Date of Patent: Mar. 2, 2021

(54) MEMORY SYSTEM AND OPERATING METHOD OF THE MEMORY SYSTEM

(71) Applicant: SK hynix Inc., Gyeonggi-do (KR)

(72) Inventors: Kang-Sub Kwak, Gyeongsangnam-do (KR); Ki-Up Kim, Chungcheongbuk-do (KR); Young-Jun Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 131 days.

(21) Appl. No.: 16/199,333

(22) Filed: Nov. 26, 2018

(65) Prior Publication Data

US 2019/0310910 A1    Oct. 10, 2019

(30) Foreign Application Priority Data

Apr. 9, 2018    (KR) .......... 10-2018-0041138

(51) Int. Cl.
*H03M 13/11*    (2006.01)
*H03M 13/15*    (2006.01)
(Continued)

(52) U.S. Cl.
CPC ........ *G06F 11/1044* (2013.01); *G06F 11/106* (2013.01); *H03M 13/1174* (2013.01);
(Continued)

(58) Field of Classification Search
None
See application file for complete search history.

(56) References Cited

U.S. PATENT DOCUMENTS 6,044,483 A  *  3/2000  Chen ............... G06F 11/1044
                                                714/48
7,366,971 B2 *  4/2008  Kikutake ........... G06F 11/1032
                                                714/703
(Continued)

FOREIGN PATENT DOCUMENTS

KR          100834366       6/2008
KR        1020090006642     1/2009
(Continued)

*Primary Examiner* — April Y Blair
*Assistant Examiner* — Matthew W Wahlin
(74) *Attorney, Agent, or Firm* — IP & T Group LLP

(57) ABSTRACT

A memory system comprises: a memory cell array suitable for storing first data and a first parity, which is used to correct an error of the first data; and an error correcting circuit suitable for generating second data and a second parity, which includes bits obtained by correcting an error of the first parity and a bit obtained by correcting an error of a second sub-parity; wherein the error correcting circuit includes: a single error correction and double error detection (SECDED) parity generator suitable for generating a second pre-parity, which includes a first sub-parity and the second sub-parity; a syndrome decoder suitable for generating a first parity error flag and a first data error flag by decoding a syndrome; a SEC parity corrector suitable for correcting an error of the first parity based on the first parity error flag; a DED parity error detector suitable for generating a second sub-parity error flag based on an error information of the first data used to generate the second sub-parity; and a DED parity corrector suitable for correcting any error of the second sub-parity based on the second sub-parity error flag.

28 Claims, 8 Drawing Sheets

(51) Int. Cl.
*H03M 13/19* (2006.01)
*G06F 11/10* (2006.01)

(52) U.S. Cl.
CPC ..... *H03M 13/154* (2013.01); *H03M 13/1575* (2013.01); *H03M 13/19* (2013.01)

(56) References Cited

U.S. PATENT DOCUMENTS

| | | | | |
|---|---|---|---|---|
| 2009/0019344 | A1* | 1/2009 | Yoon | G06F 11/1004 714/807 |
| 2017/0077963 | A1* | 3/2017 | Jung | H03M 13/6502 |
| 2017/0109231 | A1* | 4/2017 | Cha | G06F 11/1068 |
| 2017/0324425 | A1* | 11/2017 | Busch | H03M 13/616 |
| 2018/0053545 | A1* | 2/2018 | Son | G11C 7/08 |

FOREIGN PATENT DOCUMENTS

| | | |
|---|---|---|
| KR | 1020120136674 | 12/2012 |
| KR | 1020170039057 | 4/2017 |

\* cited by examiner

MEMORY SYSTEM AND OPERATING METHOD OF THE MEMORY SYSTEM

CROSS-REFERENCE TO RELATED APPLICATION

The present application claims priority under 35 U.S.C. § 119(a) to Korean Patent Application No. 10-2018-0041138, filed on Apr. 9, 2018, which is incorporated herein by reference in its entirety.

BACKGROUND

1. Field

Various embodiments of the present invention relate to a memory system, and more particularly, to a memory system for correcting an error and reducing power consumption, and a method for operating the memory system.

2. Description of the Related Art

The capacity and operation speed of semiconductor devices, which are widely used in high-performance electronic systems, are increasing.

A dynamic random access memory (DRAM), which is a type of semiconductor device, is a volatile memory, which uses capacitors as basic storage elements.

As the operation speed of the DRAM accelerates and the storage capacity of the DRAM increases, higher reliability of data transfer and lower power consumption are gradually required.

To this end, there is a growing need for a memory system that includes suitably configured circuits that perform operations to fulfill these needs.

SUMMARY

Embodiments of the present invention are directed to a memory system that includes both a core error correcting circuit and a link error correcting circuit, and a method for operating the memory system.

Embodiments of the present invention are directed to a memory system including an integrated error correcting circuit capable of concurrently performing a core error correcting operation and a link error correcting operation, and a method for operating the memory system.

Embodiments of the present invention are directed to a memory system that includes all of a core error correcting circuit, a link error correcting circuit, and a DBI portion, and a method for operating the memory system.

Embodiments of the present invention are directed to a memory system that includes both of an error correcting circuit and a DBI unit capable of concurrently performing a core error correcting operation and a link error correcting operation, and a method for operating the memory system.

In accordance with an embodiment of the present invention, a memory system comprises: a memory cell array suitable for storing first data and a first parity, which is used to correct an error of the first data; and an error correcting circuit suitable for generating second data and a second parity, which includes bits obtained by correcting an error of the first parity and a bit obtained by correcting an error of a second sub-parity; wherein the error correcting circuit includes: a single error correction and double error detection (SECDED) parity generator suitable for generating a second pre-parity, which includes a first sub-parity and the second sub-parity; a syndrome decoder suitable for generating a first parity error flag and a first data error flag by decoding a syndrome; a SEC parity corrector suitable for correcting an error of the first parity based on the first parity error flag; a DED parity error detector suitable for generating a second sub-parity error flag based on an error information of the first data used to generate the second sub-parity; and a DED parity corrector suitable for correcting any error of the second sub-parity based on the second sub-parity error flag.

In accordance with another embodiment of the present invention, a method for operating a memory system, comprises: generating second data and a second parity, which includes bits obtained by correcting an error of the first parity and a bit obtained by correcting an error of a second sub-parity; generating a second pre-parity, which includes a first sub-parity and the second sub-parity; generating a first parity error flag and a first data error flag by decoding a syndrome; correcting an error of the first parity based on the first parity error flag; generating a second sub-parity error flag based on an error information of the first data used to generate the second sub-parity; and correcting any error of the second sub-parity based on the second sub-parity error flag.

In accordance with another embodiment of the present invention, an integrated error correction code (ECC) circuit comprising: a single error correction and double error detection (SECDED) parity generator suitable for receiving first data and a first parity, which is an error correction parity for the first data, and generating a pre-parity for SECDED of the first data based on a Hamming code, the pre-parity including a first sub-parity and a second sub-parity, the first parity and the first sub-parity having a same number of bits; a syndrome generator suitable for generating a syndrome indicating error information based on the first data, the first parity, and the first sub-parity; a data corrector suitable for receiving the first data, correcting the first data based on the syndrome, and generating the corrected first data as second data to be transmitted through a channel; and a parity corrector suitable for correcting the first parity based on the syndrome, correcting the second sub-parity based on the syndrome, and outputting the corrected first parity and the corrected second sub-parity as a second parity as an error correction parity for the second data.

DETAILED DESCRIPTION

Figure 1A:
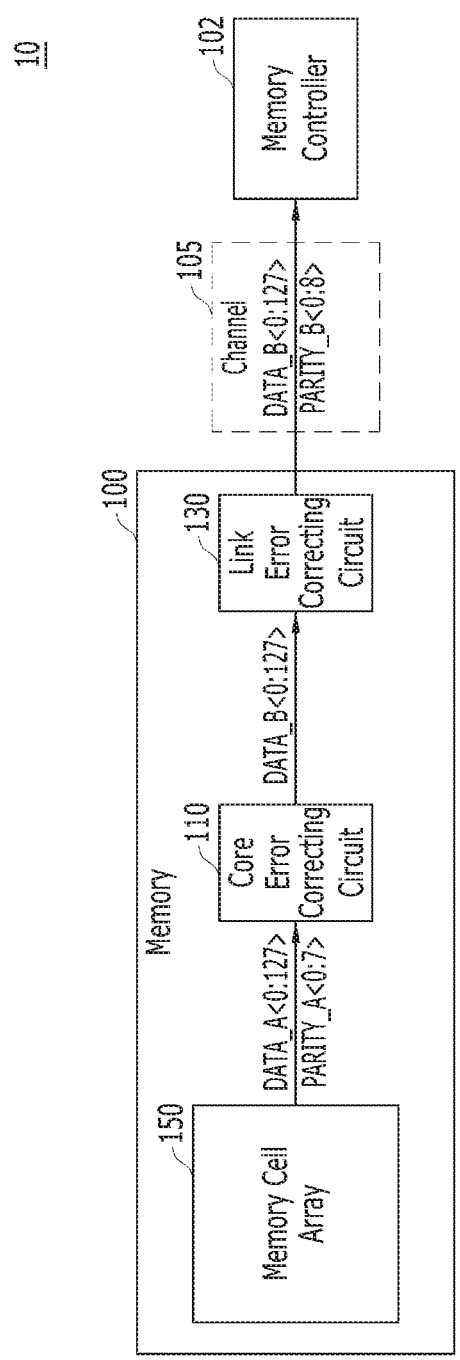
FIGS. 1A and 1B are block diagrams illustrating a memory system including both a core error correcting circuit and a link error correcting circuit in accordance with an embodiment of the present invention.

Various embodiments of the present invention will be described below in more detail with reference to the accompanying drawings. The present invention may, however, be embodied in different forms and thus is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment," or the like is not necessarily to only one embodiment, and different references to any such phrase is not necessarily to the same embodiment(s).

Embodiments of the present invention now will be described in detail with reference to the accompanying drawings.

In various embodiments, a memory system may include the function of a core error correcting circuit and the function of a link error correcting circuit.

Figure 1B:
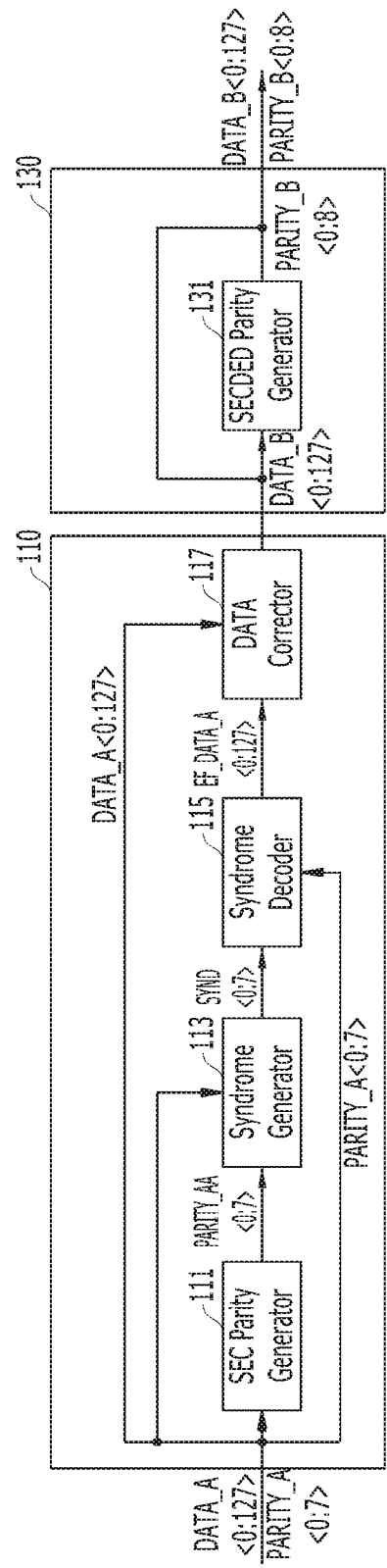

FIGS. 1A and 1B are block diagrams illustrating a memory system 10 including a core error correcting circuit 110 and a link error correcting circuit 130 in accordance with an embodiment of the present invention. Referring to FIG. 1A, the memory system 10 may include a memory 100 and a memory controller 102. The memory 100 may include the core error correcting circuit 110 and the link error correcting circuit 130 to correct an error of data stored in the memory cell array 150 and transfer data from the memory cell array 150 to the memory controller 102.

The memory controller 102 may supply various signals for controlling the memory 100, such as a command/address signal CMD/ADD, a clock signal CLK, and a data signal DQ, through a channel 105.

The memory controller 102 and the memory 100 may transmit and receive data through the channel 105 to and from each other.

The memory cell array 150 may include a volatile memory, such as a dynamic random access memory (DRAM) and a static random access memory (SRAM).

The memory cell array 150 may include a plurality of memory cells (not shown) for storing data.

Although the memory cell array 150 is described as a single memory cell array, this is merely an example; the description herein may be equally applied to a memory including a plurality of memory cell arrays.

The first data DATA_A<0:127> may be stored in the memory cell array 150. An error may occur in the stored first data DATA_A<0:127> as a result of malfunction or deterioration of a memory cell.

A first parity PARITY_A<0:7> may be stored in the memory cell array to correct the error of the first data DATA_A<0:127> stored in the memory cell array 150. The first parity PARITY_A<0:7> may be a parity related to a single error correction (SEC) of the first data DATA_A<0:127> stored in the memory cell array 150. The single error correction may be performed based on a Hamming Code.

The core error correcting circuit 110 may perform a single error correction (SEC) on the first data DATA_A<0:127> based on the first parity PARITY_A<0:7> so as to generate second data DATA_B<0:127> in which the error of the first data DATA_A<0:127> is corrected. Thus, the second data represents an error-corrected version of the first data.

Referring to FIG. 1B, the core error correcting circuit 110 may include an SEC parity generator 111, a syndrome generator 113, a syndrome decoder 115, and a data corrector 117.

The SEC parity generator 111 may generate a second parity PARITY_AA<0:7> based on the first data DATA_A<0:127>. The SEC parity generator 111 may generate the second parity PARITY_AA<0:7> according to a rule defined in a Hamming Code.

For example, in the principle described with reference to Table 1 below, the first bit PARITY_AA0 of the second parity PARITY_AA<0:7> may include a value generated by performing an XOR operation on a data bit which is selected based on the Hamming Code among the 128 bits of the first data DATA_A<0:127>.

In the same manner, the values of the second bit PARITY_AA1 of the second parity PARITY_AA<0:7> to the eighth bit PARITY_AA7 of the second parity PARITY_AA<0:7> may be decided by the SEC parity generator 111 so as to generate the second parity PARITY_AA<0:7>.

The syndrome generator 113 may receive the first data DATA_A<0:127>, the first parity PARITY_A<0:7> and the second parity PARITY_AA<0:7>, and generate a syndrome SYND<0:7>. The syndrome generator 113 may generate the syndrome SYND<0:7> by performing an XOR operation on the first data DATA_A<0:127> and the first parity PARITY_A<0:7> and the bits of the second parity PARITY_AA<0:7> based on a syndrome generation rule which is defined in the Hamming Code. The syndrome SYND<0:7> may be information obtained by encoding error position information of the first data DATA_A<0:127>.

The syndrome decoder 115 may decode the syndrome SYND<0:7> and generate a first data error flag EF_DATA_A<0:127> representing the error position information of the first data DATA_A<0:127>. The first data error flag EF_DATA_A<0:127> may indicate which bit of the first data DATA_A<0:127> includes an error.

For example, when EF_DATA_A0 bit is 1, that indicates that DATA_A0 bit has an error. When the EF_DATA_A0 bit is 0, that indicates that the EF_DATA_A0 bit does not have an error.

The data corrector 117 may receive the first data DATA_A<0:127> and the first data error flag EF_DATA_A<0:127> and generate second data DATA_B<0:127>, which is a result of correcting the error bit of the first data DATA_A<0:127>.

Referring back to FIG. 1A, the link error correcting circuit 130 may receive the second data DATA_B<0:127> and generate the link data DATA_B<0:127> and the second parity PARITY_B<0:8>. The second parity PARITY_B<0:8> may include a total of 9 bits including a parity PARITY_B8 for double error detection (DED) of the link data DATA_B<0:127> in addition to the 8 bits PARITY_B<0:7> for the single error correction (SEC) of the link data DATA_B<0:127>. In other words, the second parity PARITY_B<0:8> is configured for both single error correction and double error detection (SECDED) of the link data DATA_B<0:127>.

Referring to FIG. 1B, the link error correcting circuit 130 may include a SECDED parity generator 131. The SECDED parity generator 131 may receive the second data DATA_B<0:127> and generate the second parity PARITY_B<0:8> according to the parity bit generation rule which is defined based on the Hamming Code. The link data DATA_B<0:127> may be the same as the second data DATA_B<0:127>.

As described above, the memory system 10 may require the core error correcting circuit 110 including the SEC parity generator 111 and the link error correcting circuit 130 including the SECDED parity generator 131 in order to generate the second parity PARITY_B<0:8> from the first data DATA_A<0:127> and the first parity PARITY_A<0:7>.

Since the above-described memory system includes both the SEC parity generator 111 and the SECDED parity generator 131, there may be concerns, such as increase in the latency of an error correcting operation, increase in the power consumption, and increase in the area of the error correcting circuit. This is because the constituent element occupying the biggest area in an error correcting circuit is a parity generator.

Thus, in accordance with another embodiment of the present invention, there is provided a method for generating the second parity PARITY_B<0:8>, which is a parity for SECDED having a total of 9 bits, from the first parity PARITY_A<0:7> having 8 bits, while maintaining the number of the parity bits stored in a memory cell, which is 8, in which only one parity generator for performing the SECDED operation is used. In these embodiments, the second parity PARITY_B<0:8> includes one more bit, e.g., a ninth bit, in addition to the 8 bits of the first parity PARITY_A<0:7>.

Figure 2A:
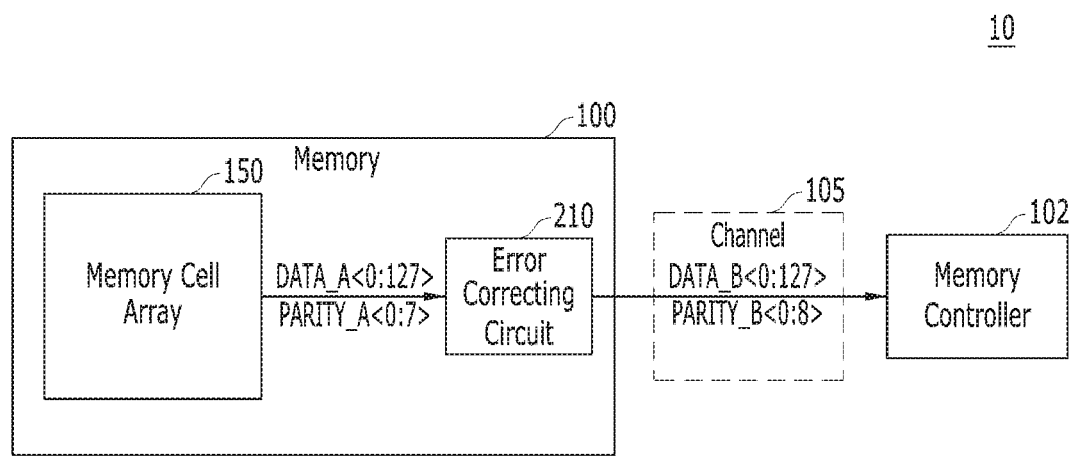
FIGS. 2A and 2B are block diagrams illustrating a memory system including an error correcting circuit in accordance with an embodiment of the present invention.
Figure 2B:
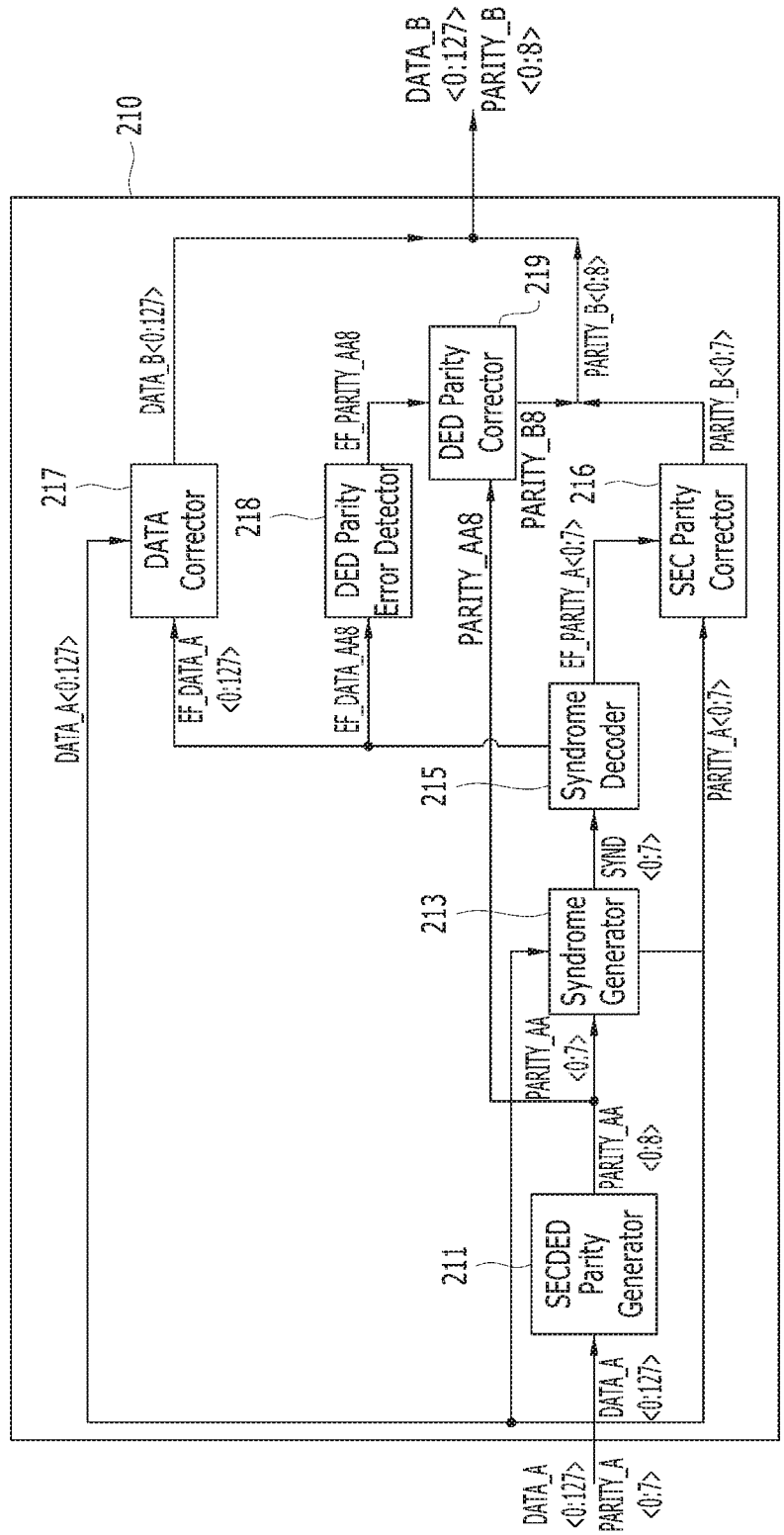

FIGS. 2A and 2B are block diagrams illustrating a memory system 10 in accordance with an embodiment of the present invention. Referring to FIG. 2A, the memory system 10 may include an error correcting circuit 210 which has only one parity generator, performs both the operation of the core error correcting circuit 110 and the operation of the link error correcting circuit 130, corrects an error of a data, and generates a parity for the data.

The first data DATA_A<0:127> may be stored in the memory cell array 150. An error may occur in the first data DATA_A<0:127> as a result of, for example, deterioration of the memory cell. To correct the error of the first data DATA_A<0:127>, the first parity PARITY_A<0:7> may be stored in the memory cell array 150. The first parity PARITY_A<0:7> may be used to correct a single error, e.g., performs single error correction (SEC), of the first data DATA_A<0:127>. The single error correction may be performed based on the Hamming Code.

The error correcting circuit 210 may generate the link data DATA_B<0:127>, which is obtained by correcting a single error of the first data DATA_A<0:127>.

Also, the error correcting circuit 210 may generate the second parity PARITY_B<0:8> of 9 bits, which is a parity for single error correction and double error detection (SECDED) performed onto the link data DATA_B<0:127>.

Referring to FIG. 2B, the error correcting circuit 210 may include an SECDED parity generator 211, a syndrome generator 213, a syndrome decoder 215, an SEC parity corrector 216, a data corrector 217, a DED parity error detector 218, and a DED parity corrector 219.

The SECDED parity generator 211 may receive the first data DATA_A<0:127> to generate a 9-bit second pre-parity PARITY_AA<0:8>. The SECDED parity generator 211 may generate the second pre-parity PARITY_AA<0:8> according to a rule defined in the Hamming Code, as described earlier with reference to Table 1 below. For example, the first bit PARITY_AA0 of the second pre-parity PARITY_AA<0:8> may be a value obtained by performing an XOR operation on the data bits that are selected among the 128 bits of the first data DATA_A<0:127> according to the Hamming Code. In the same manner, the SECDED parity generator 211 may decide the values of a sub-parity PARITY_AA1 to a sub-parity PARITY_AA8 and generate the second pre-parity PARITY_AA<0:8> based on the values of the sub-parity PARITY_AA1 and the sub-parity PARITY_AA8. The sub-parity PARITY_AA1 is the second bit of the second pre-parity PARITY_AA<0:8>, and the sub-parity PARITY_AA8 is the ninth bit of the second pre-parity PARITY_AA<0:8>. The second pre-parity PARITY_AA<0:8> includes a first sub-parity PARITY_AA<0:7> and a second sub-parity PARITY_AA<8>.

The syndrome generator 213 may receive the first data DATA_A<0:127>, the first parity PARITY_A<0:7>, and the 8-bit first sub-parity PARITY_AA<0:7>, and generate the syndrome SYND<0:7>.

The 8-bit first sub-parity PARITY_AA<0:7> may be a parity excluding the second sub-parity PARITY_AA8, which is the ninth parity bit in the 9-bit second pre-parity PARITY_AA<0:8>.

Since the second sub-parity PARITY_AA8 is a bit that does not correspond to the eight bits of the first parity PARITY_A<0:7> and the second sub-parity PARITY_AA8 is a bit that is generated based on the first data DATA_A<0:127> where there may be an error, the syndrome generator 213 and the syndrome decoder 215 may generate error information (i.e., an error flag) for the second sub-parity PARITY_AA8.

Accordingly, the error correcting circuit 210 may include a DED parity error detector 218 for checking whether there is an error or not in the second sub-parity PARITY_AA8 and a DED parity corrector 219 for correcting an error of the second sub-parity PARITY_AA8.

The syndrome generator 213 may generate syndrome SYND<0:7> by performing an XOR operation onto the first data DATA_A<0:127> and the first sub-parity PARITY_AA<0:7> and the bits of the first parity PARITY_A<0:7> according to the syndrome generation rule defined in the Hamming Code. The syndrome SYND<0:7> may be information obtained by encoding error position information of the first data DATA_A<0:127>.

The syndrome decoder 215 may generate a first parity error flag EF_PARITY_A<0:7> and a first data error flag EF_DATA_A<0:127> by decoding the syndrome SYND<0:7>. The first parity error flag EF_PARITY_A<0:7> represents the error position information of the first parity PARITY_A<0:7>. The first data error flag EF_DATA_A<0:127> represents the error position information of the first data DATA_A<0:127>.

The first parity error flag EF_PARITY_A<0:7> may indicate which bit of the first parity PARITY_A<0:7> has an error. For example, when the EF_PARITY_A0 bit is 1, that indicates that the PARITY_A0 bit includes an error. When the EF_PARITY_A0 bit is 0, that indicates that the PARITY_A0 bit does not include an error.

Also, the first data error flag EF_DATA_A<0:127> may indicate which bit of the first data DATA_A<0:127> has an error. For example, when the EF_DATA_A0 bit is 1, that indicates that the DATA_A0 bit includes an error. When the EF_DATA_A0 bit is 0, that indicates that the DATA_A0 bit does not include an error.

The SEC parity corrector 216 may receive the first parity PARITY_A<0:7> and the first parity error flag EF_PARITY_A<0:7>, and generate a parity PARITY_B<0:7>, which is a result of correcting the error bit of the first parity PARITY_A<0:7>.

The data corrector 217 may receive the first data DATA_A<0:127> and the first data error flag EF_DATA_A<0:127> and generate the link data DATA_B<0:127>, which is a result of correcting the error bit of the first data DATA_A<0:127>.

The DED parity error detector 218 may receive a second sub-parity error detection flag EF_DATA_AA8 among the first data error flag EF_DATA_A<0:127> generated by the syndrome decoder 215. The second sub-parity error detection flag EF_DATA_AA8 is error information for the bits of the first data DATA_A<0:127> that the SECDED parity generator 211 used to generate the second sub-parity PARITY_AA8.

When there is an error in the bits of the first data DATA_A<0:127> that the SECDED parity generator 211 used to generate the second sub-parity PARITY_AA8, there is an error in the second sub-parity PARITY_AA8 too.

Therefore, the DED parity error detector 218 may determine whether there is an error or not in the bits of the first data DATA_A<0:127> that the SECDED parity generator 211 used to generate the second sub-parity PARITY_AA8, and may detect an error of the second sub-parity PARITY_AA8.

The DED parity error detector 218 may perform an OR gating operation on the bits of the first data DATA_A<0:127> that the SECDED parity generator 211 used to generate the second sub-parity PARITY_AA8, and detect whether there is an error or not in the second sub-parity PARITY_AA8.

When there is no error in the bits of the first data DATA_A<0:127> that the SECDED parity generator 211 used to generate the second sub-parity PARITY_AA8, there is no error in the second sub-parity PARITY_AA8 either. Therefore, the second sub-parity error detection flag EF_DATA_AA8 may have a logic low level. Accordingly, the DED parity error detector 218 may generate second sub-parity error flag EF_PARITY_AA8 by assigning a logic low level to the second sub-parity error detection flag EF_DATA_AA8.

When there is a single error in the bits of the first data DATA_A<0:127> that the SECDED parity generator 211 used to generate the second sub-parity PARITY_AA8, there is a single error in the second sub-parity PARITY_AA8, too. Therefore, the second sub-parity error detection flag EF_DATA_AA8 may have a logic high level. Accordingly, the DED parity error detector 218 may generate second sub-parity error flag EF_PARITY_AA8 by assigning a logic high level to the second sub-parity error detection flag EF_DATA_AA8.

The DED parity corrector 219 may receive the second sub-parity error flag EF_PARITY_AA8 and the second sub-parity PARITY_AA8. When the second sub-parity error flag EF_PARITY_AA8 has a logic low level, an inversion second sub-parity PARITY_B8 which is the same as the logic level of the second sub-parity PARITY_AA8 may be generated.

Also, the DED parity corrector 219 may generate the inversion second sub-parity PARITY_B8 which has an inverted logic level of the second sub-parity PARITY_AA8, when the second sub-parity error flag EF_PARITY_AA8 has a logic high level.

As a result, the second parity PARITY_B<0:8> may include bits that include the PARITY_B<0:7> and the PARITY_B8. The second parity PARITY_B<0:8> may include a total of 9 bits that include eight bits PARITY_B<0:7> for single error correction of the link data DATA_B<0:127> and the PARITY_B8 for double error detection of the link data DATA_B<0:127>.

In other words, as described above, the memory system of FIGS. 2A and 2B may generate the second parity PARITY_B<0:8> for the SECDED of the link data DATA_B<0:127> through the DED parity error detector 218 and the DED parity corrector 219, while including only one parity generator, i.e., the SECDED parity generator 211.

In the memory system of FIGS. 1A and 1B, two parity generators are employed. In contrast, in the memory system of FIGS. 2A and 2B, both the function of the core error correcting circuit and the function of the link error correcting circuit may be performed with one parity generator. Since the DED parity error detector 218 and the DED parity corrector 219 occupy a very small area compared with the parity generator, the overall area of the memory 100 may be greatly reduced.

As a result, the memory 100 may reduce the latency and power consumption of the error correcting operation and the area of the error correcting circuit when the parity generators 111 and 131 are operated, which are improvements.

In various embodiments, with reference to FIGS. 3A to 4B, a memory system may include an error correcting circuit and a data bus inversion (DBI) circuit.

Figure 3A:
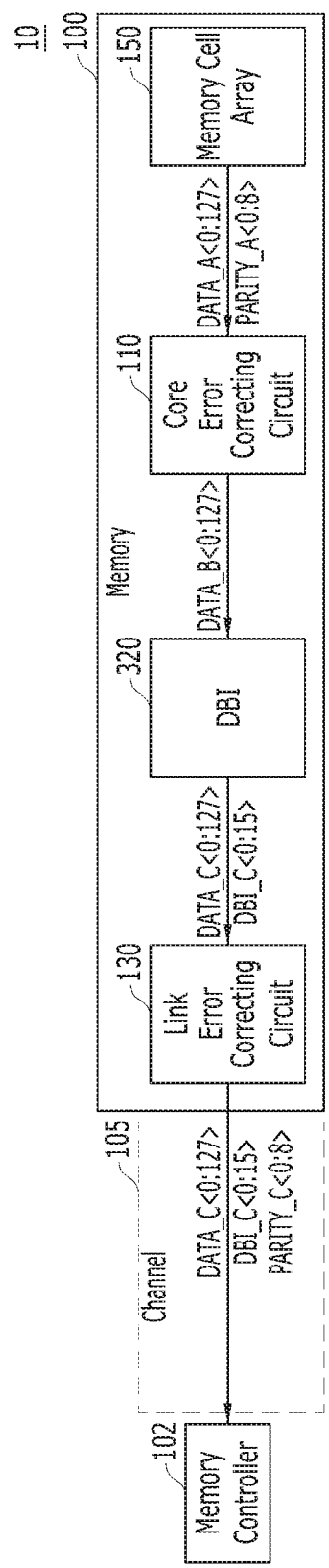
FIGS. 3A and 3B are block diagrams illustrating a memory system including all of a core error correcting circuit, a link error correcting circuit, and a data bus inversion (DBI) circuit in accordance with an embodiment of the present invention.

FIG. 3A is a block diagram illustrating a memory system 10 in accordance with an embodiment of the present invention. Referring to FIG. 3A, the memory system 10 may include a memory 100 and a memory controller 102. The memory 100 may include a memory cell array 150, a core error correcting circuit 110, a link error correcting circuit 130, and a DBI circuit 320. The illustration is with respect to a read operation on the memory 100.

The memory controller 102 may supply various signals for controlling the memory 100 such as a command/address signal CMD/ADD, a clock signal CLK, and a data signal DQ to the channel 105.

The memory controller 102 and the memory 100 may transmit and receive data to and from each other through the channel 105.

The memory cell array 150 may include a volatile memory such as a dynamic random access memory (DRAM) and a static random access memory (SRAM).

The memory cell array 150 may include a plurality of memory cells (now shown) for storing data.

Although the memory cell array 150 is described herein as a single memory cell array, this is merely an example; the description herein may be equally applied to the memory 100 including a plurality of memory cell arrays.

The first data DATA_A<0:127> may be stored in the memory cell array 150. An error may occur in the first data DATA_A<0:127> as a result of, for example, deterioration of a memory cell.

In order to correct the error of the first data DATA_A<0:127>, the first parity PARITY_A<0:8> may be stored in the memory cell array 150.

The first parity PARITY_A<0:8> may be a parity for single error correction and double error detection (SECDED) of the first data DATA_A<0:127> stored in the memory cell array 150.

This error correction may be performed based on the Hamming Code.

The core error correcting circuit 110 may correct an error of the first data DATA_A<0:127> based on the first parity PARITY_A<0:8> and generate the second data DATA_B<0:127>.

The DBI circuit 320 may generate a third data DATA_C<0:127> and a DBI flag DBI_C<0:15>. The third data DATA_C<0:127> is generated by deciding whether the bits of the second data DATA_B<0:127> are inverted or not according to the number of logic values or levels of the bits of the second data DATA_B<0:127>. The DBI flag DBI_C<0:15> represents inversion information of the third data DATA_C<0:127>.

TABLE 1

|  | DQ0 | DQ1 | DQ2 | DQ3 | DQ4 | DQ5 | DQ6 | DQ7 | DBI_C |
|---|---|---|---|---|---|---|---|---|---|
| BL0 | 0 | 16 | 32 | 48 | 64 | 80 | 96 | 112 | 0 |
| BL1 | 1 | 17 | 33 | 49 | 65 | 81 | 97 | 113 | 1 |
| BL2 | 2 | 18 | 34 | 50 | 66 | 82 | 98 | 114 | 2 |
| BL3 | 3 | 19 | 35 | 51 | 67 | 83 | 99 | 115 | 3 |
| BL4 | 4 | 20 | 36 | 52 | 68 | 84 | 100 | 116 | 4 |
| BL5 | 5 | 21 | 37 | 53 | 69 | 85 | 101 | 117 | 5 |
| BL6 | 6 | 22 | 38 | 54 | 70 | 86 | 102 | 118 | 6 |
| BL7 | 7 | 23 | 39 | 55 | 71 | 87 | 103 | 119 | 7 |
| BL8 | 8 | 24 | 40 | 56 | 72 | 88 | 104 | 120 | 8 |
| BL9 | 9 | 25 | 41 | 57 | 73 | 89 | 105 | 121 | 9 |
| BL10 | 10 | 26 | 42 | 58 | 74 | 90 | 106 | 122 | 10 |
| BL11 | 11 | 27 | 43 | 59 | 75 | 91 | 107 | 123 | 11 |
| BL12 | 12 | 28 | 44 | 60 | 76 | 92 | 108 | 124 | 12 |
| BL13 | 13 | 29 | 45 | 61 | 77 | 93 | 109 | 125 | 13 |
| BL14 | 14 | 30 | 46 | 62 | 78 | 94 | 110 | 126 | 14 |
| BL15 | 15 | 31 | 47 | 63 | 79 | 95 | 111 | 127 | 15 |

Table 1 shows that 128 bits of the second data DATA_B<0:127> are grouped into 16 sets BL0 to BL15. The $0^{th}$ bit to the $15^{th}$ bit, that is, a total of 16 bits of the second data DATA_B<0:127>, may correspond to DQ0. Likewise, the $112^{th}$ to $127^{th}$ of the second data DATA_B<0:127>, that is, a total of 16 bits of the second data DATA_B<0:127>, may correspond to DQ7. Herein, it should be noted that the method of grouping (or dividing) the data into the data sets as shown in Table 1 is merely an example.

The 16 bits of the DBI flag DBI_C<0:15> may correspond to the 16 sets BL0 to BL15 of the second data DATA_B<0:127>, respectively. The first bit DBI_C0 of the DBI flag DBI_C<0:15> may represent inversion information for the bits corresponding to the BL0 set of the second data DATA_B<0:127>, which are DATA_B0, DATA_B16, DATA_B32, DATA_B48, DATA_B64, DATA_B80, DATA_B 96, and DATA_B 112. Likewise, the $16^{th}$ bit DBI_C15 of the DBI flag DBI_C<0:15> may represent inversion information for the bits corresponding to the BL15 set of the second data DATA_B<0:127>, which are DATA_B15, DATA_B31, DATA_B47, DATA_B63, DATA_B79, DATA_B95, DATA_B11, and DATA_B127.

The logic value (or level) of each bit of the DBI flag DBI_C<0:15> may be decided based on the logic value of the bits corresponding to each set of the second data DATA_B<0:127> corresponding to each bit of the DBI flag DBI_C<0:15>.

For example, when there are five or more bits that have a logic high level among the bits corresponding to the BL0 set of the second data DATA_B<0:127>, which are DATA_B0, DATA_B16, DATA_B32, DATA_B48, DATA_B64, DATA_B80, DATA_B96 and DATA_B112, the DBI_C0 may have a logic high level which represents that an inversion operation is performed onto the bits corresponding to the BL0 set of the second data DATA_B<0:127>.

On the other hand, when there are less than 5 bits that have a logic high level among the bits corresponding to the BL0 set of the second data DATA_B<0:127>, which are DATA_B0, DATA_B16, DATA_B32, DATA_B48, DATA_B64, DATA_B80, DATA_B96 and DATA_B112, the DBI_C0 may have a logic low level which represents that an inversion operation is performed onto the bits corresponding to the BL0 set of the second data DATA_B<0:127>.

The DBI circuit 320 may check the logic levels of the bits of the second data DATA_B<0:127> and then decide whether the bits of the second data DATA_B<0:127> are inverted or not and generate the DBI flag DBI_C<0:15> representing inversion information.

For example, when there are five or more bits that have a logic high level among the bits corresponding to the BL0 set of the second data DATA_B<0:127>, which are DATA_B0, DATA_B16, DATA_B32, DATA_B48, DATA_B64, DATA_B80, DATA_B96 and DATA_B112, the DBI circuit 320 may invert the logic level of each of DATA_B0, DATA_B16, DATA_B32, DATA_B48, DATA_B64, DATA_B80, DATA_B96 and DATA_B112 and generate DBI_C0 having a logic high level.

Likewise, when there are less than five bits that have a logic high level among the bits corresponding to the BL15 set of the second data DATA_B<0:127>, which are DATA_B15, DATA_B31, DATA_B47, DATA_B63, DATA_B79, DATA_B95, DATA_B111 and DATA_B127, the DBI circuit 320 may generate DBI_C15 having a logic low level without inverting the logic level of each of DATA_B15, DATA_B31, DATA_B47, DATA_B63, DATA_B79, DATA_B95, DATA_B111 and DATA_B127.

According to this principle, the DBI circuit 320 may determine whether to invert the bits of the second data DATA_B<0:127> and generate the third data DATA_C<0:127> and the DBI flag DBI_C<0:15>.

The link error correcting circuit 130 may receive the third data DATA_C<0:127> and the DBI flag DBI_C<0:15> and generate a third parity PARITY_C<0:8>, which is a parity for the SECDED of the third data DATA_C<0:127> and the DBI flag DBI_C<0:15>. The third parity PARITY_C<0:8> may be generated according to a rule defined in the Hamming Code.

TABLE 2

|  | DQ0 | DQ1 | DQ2 | DQ3 | DQ4 | DQ5 | DQ6 | DQ7 | DBI_C |
|---|---|---|---|---|---|---|---|---|---|
| BL0 | 0 |  | 32 | 48 |  |  |  |  | 0 |
| BL1 | 1 | 17 |  |  | 65 | 81 | 97 | 113 |  |
| BL2 |  |  | 34 | 50 |  |  |  |  | 2 |
| BL3 | 3 | 19 |  |  | 67 | 83 | 99 | 115 |  |
| BL4 | 4 |  | 36 | 52 |  |  |  |  | 4 |
| BL5 |  | 21 |  |  | 69 | 85 | 101 | 117 |  |
| BL6 | 6 |  | 38 | 54 |  |  |  |  | 6 |
| BL7 |  | 23 |  |  | 71 | 87 | 103 | 119 |  |
| BL8 | 8 |  | 40 | 56 |  |  |  | 120 | 8 |
| BL9 |  | 25 |  | 57 | 73 | 89 | 105 |  |  |
| BL10 | 10 | 26 | 42 |  |  |  |  | 122 | 10 |
| BL11 | 11 |  |  | 59 | 75 | 91 | 107 |  |  |
| BL12 |  | 28 | 44 |  |  |  |  | 124 | 12 |
| BL13 | 13 |  |  | 61 | 77 | 93 | 109 |  |  |
| BL14 |  | 30 | 46 |  |  |  |  | 126 | 14 |
| BL15 | 15 |  |  | 63 | 79 | 95 | 111 |  |  |

Table 2 shows only the bits of the third data DATA_C<0:127> and the bits of the DBI flag DBI_C<0:15> required to generate PARITY_C0 according to the rule defined in the Hamming Code.

The logic value of PARITY_C0 is obtained by performing an XOR operation on the bits shown in Table 2. With the same principle, the link error correcting circuit 130 may also decide PARITY_C1 to PARITY_C8, and generate the third parity PARITY_C<0:8>.

Figure 3B:
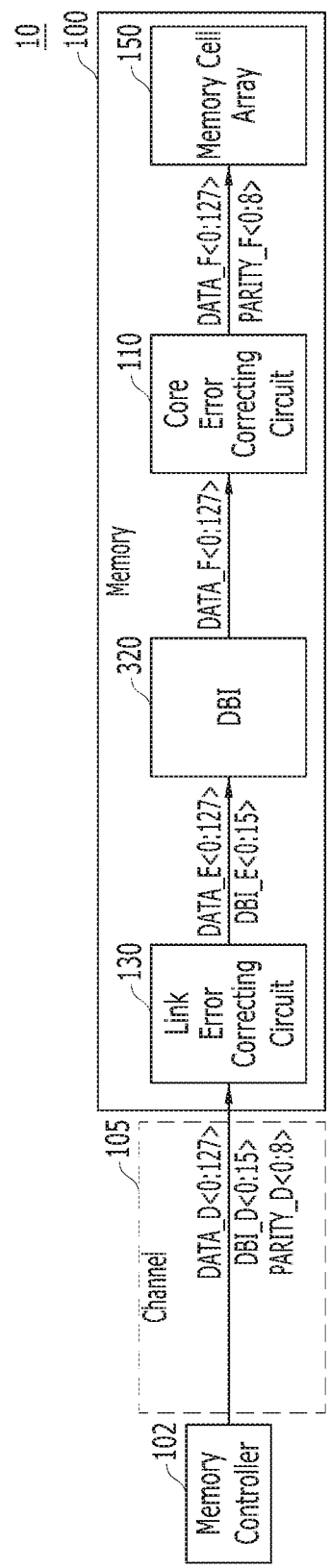

FIG. 3B is a block diagram illustrating a memory system 10 in accordance with an embodiment of the present invention. Referring to FIG. 3B, the memory system 10 may include a memory 100 and a memory controller 102. The memory 100 may including a memory cell array 150, a core error correcting circuit 110, a link error correcting circuit 130, and a DBI circuit 320. The illustration is with respect to a write operation on the memory 100.

The memory controller 102 may transfer a first data DATA_D<0:127>, a first DBI flag DBI_D<0:15>, and a first parity PARITY_D<0:8> to the memory 100 through a channel 105. In the process in which the memory controller 102 transfers the first data DATA_D<0:127>, the first DBI flag DBI_D<0:15>, and the first parity PARITY_D<0:8> to the memory 100, an error may occur in the first data DATA_D<0:127>, the first DBI flag DBI_D<0:15>, and/or the first parity PARITY_D<0:8>.

The link error correcting circuit 130 may receive the first data DATA_D<0:127>, the first DBI flag DBI_D<0:15>, and the first parity PARITY_D<0:8> and generate a second data DATA_E<0:127> and a second DBI flag DBI_E<0:15>. The second data DATA_E<0:127> and the second DBI flag DBI_E<0:15> may be generated by correcting errors of the first data DATA_D<0:127> and the first DBI flag DBI_D<0:15> based on the first parity PARITY_D<0:8>, which is a parity for the SECDED of the first data DATA_D<0:127> and the first DBI flag DBI_D<0:15>.

The DBI circuit 320 may receive the second data DATA_E<0:127> and the second DBI flag DBI_E<0:15>, and generate a third data DATA_F<0:127>. The third data DATA_F<0:127> may be generated by deciding whether the bits of the second data DATA_E<0:127> are inverted or not based on the second DBI flag DBI_E<0:15> having inversion information of the second data DATA_E<0:127>.

The core error correcting circuit 110 may receive the third data DATA_F<0:127>, and generate a third parity PARITY_F<0:8>, which is a parity for SECDED of the third data DATA_F<0:127>. This is for correcting an error that may occur in the third data DATA_F<0:127> stored in the memory cell in a subsequent read operation.

Therefore, according to the embodiment of the present invention described with reference to FIGS. 3A and 3B, it is possible to correct the data stored in the memory cell array 150 through the core error correcting circuit 110 and the link error correcting circuit 130, and generate an error correction parity for errors that may occur in the channel 105. Also, with the DBI circuit 320, the number of high logic level bits of the data bits passing through the channel 105 may be reduced, thereby reducing power consumption.

When the DBI circuit 320 is provided and a read operation of the memory 100 is performed, in order to generate the third parity PARITY_C<0:8>, which is a parity for the SECDED of the third data DATA_C<0:127>, the third data DATA_C<0:127> may be generated by performing the inversion operation through the DBI circuit 320 and the third parity PARITY_C<0:8> may be generated by operating the link error correcting circuit 130 later.

When the DBI circuit 320 is provided and a write operation of the memory 100 is performed, in order to generate the third parity PARITY_F<0:8>, which is a parity for the SECDED of the third data DATA_F<0:127>, the third data DATA_F<0:127> may be generated by performing an inversion operation using the DBI circuit 320 and thereafter the third parity PARITY_F<0:8> may be generated by operating the core error correcting circuit 110.

Figure 4A:
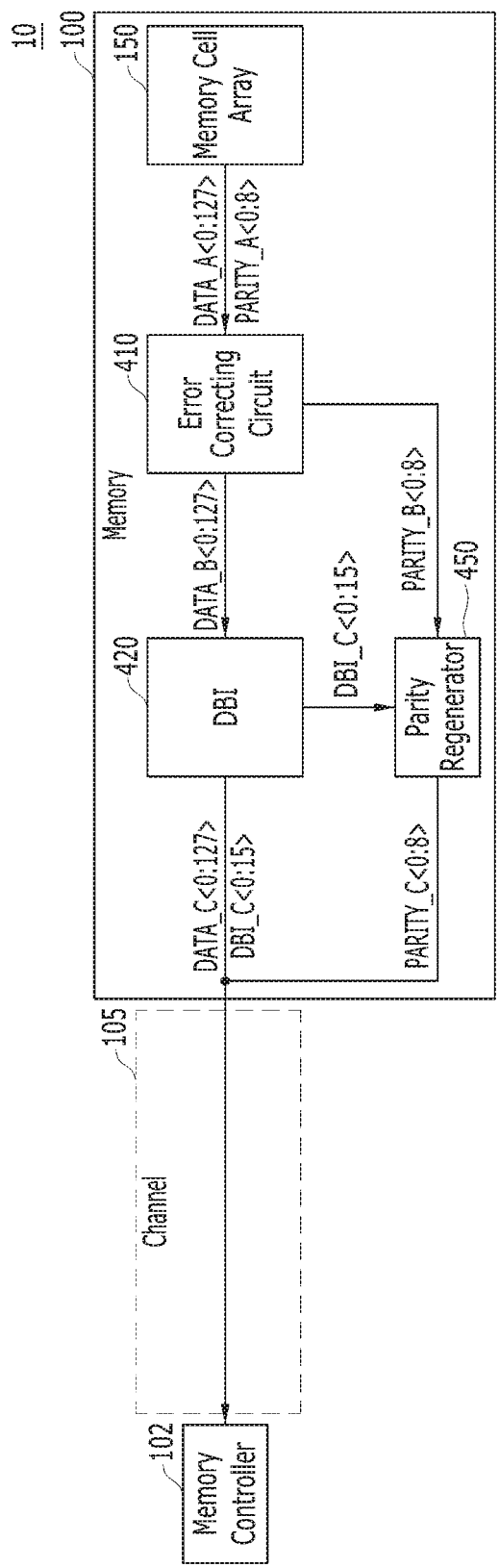
FIGS. 4A and 4B are block diagrams illustrating a memory system including error correcting circuit and DBI circuits in accordance with an embodiment of the present invention.

FIG. 4A is a block diagram illustrating a memory system 10 in accordance with an embodiment of the present invention. Referring to FIG. 4A, the memory system 10 may include a memory 100 and a memory controller 102. The memory 100 may include an error correcting circuit 410, a DBI circuit 420, and a parity regenerator 450 in a read operation of a memory system.

The first data DATA_A<0:127> may be stored in the memory cell array 150. An error may occur in the first data DATA_A<0:127> as a result of, for example, deterioration of a memory cell. The first parity PARITY_A<0:8> may be stored in the memory cell array 150 to correct an error in the first data DATA_A<0:127>. The first parity PARITY_A<0:8> may be for the single error correction and double error detection (SECDED) of the first data DATA_A<0:127>. This error correction may be performed based on the Hamming Code.

The error correcting circuit 410 may correct the error of the first data DATA_A<0:127> based on the first parity PARITY_A<0:8> and generate an error-corrected second data DATA_B<0:127>.

The error correcting circuit 410 may generate the second parity PARITY_B<0:8> which is a parity for the SECDED of the second data DATA_B<0:127>.

When the error correcting circuit 410 generates the second parity PARITY_B<0:8>, the principle described with reference to Table 2 may be equally applied.

Particularly, the error correcting circuit 410 may generate the second parity PARITY_B<0:8> for a total of 144 bits which include the 16 DBI flag bits in addition to the 128 bits forming the second data DATA_B<0:8>.

According to an embodiment of the present invention, the error correcting circuit 410 may generate the second parity PARITY_B<0:8> based on the assumption that the DBI flag bits necessary for generating the second parity PARITY_B<0:8> have a logic low level.

According to another embodiment of the present invention, the error correcting circuit 410 may receive virtual DBI flag bits all of which have a logic low level and generate the second parity PARITY_B<0:8>.

The DBI circuit 420 may generate a third data DATA_C<0:127> and a DBI flag DBI_C<0:15>. The third data DATA_C<0:127> may be generated by deciding whether the bits of the second data DATA_B<0:127> are inverted or not based on the logic values of the bits forming the second data DATA_B<0:127>. The DBI flag DBI_C<0:15> represents the inversion information of the third data DATA_C<0:127>.

The parity regenerator 450 may generate the third parity PARITY_C<0:8>, which is a parity for the SECDED of the third data DATA_C<0:127>, based on the second parity PARITY_B<0:8> and the DBI flag DBI_C<0:15>.

To be specific, the parity regenerator 450 may transform the second parity PARITY_B<0:8> into the third parity PARITY_C<0:8> by using the DBI flag DBI_C<0:15>.

TABLE 3

|     | DQ0 | DQ1 | DQ2 | DQ3 | DQ4 | DQ5 | DQ6 | DQ7 | DBI_C | # |
|-----|-----|-----|-----|-----|-----|-----|-----|-----|-------|---|
| BL0 | 0   |     | 32  | 48  |     |     |     |     | 0     | 4 |
| BL1 | 1   | 17  |     |     | 65  | 81  | 97  | 113 |       | 6 |
| BL2 |     |     | 34  | 50  |     |     |     |     | 2     | 3 |
| BL3 | 3   | 19  |     |     | 67  | 83  | 99  | 115 |       | 6 |
| BL4 | 4   |     | 36  | 52  |     |     |     |     | 4     | 4 |
| BL5 |     | 21  |     |     | 69  | 85  | 101 | 117 |       | 5 |
| BL6 | 6   |     | 38  | 54  |     |     |     |     | 6     | 4 |
| BL7 |     | 23  |     |     | 71  | 87  | 103 | 119 |       | 5 |

TABLE 3-continued

|      | DQ0 | DQ1 | DQ2 | DQ3 | DQ4 | DQ5 | DQ6 | DQ7 | DBI_C | #  |
|------|-----|-----|-----|-----|-----|-----|-----|-----|-------|----|
| BL8  | 8   |     | 40  | 56  |     |     |     | 120 | 8     | 5  |
| BL9  |     | 25  |     | 57  | 73  | 89  | 105 |     |       | 5  |
| BL10 | 10  | 26  | 42  |     |     |     |     | 122 | 10    | 5  |
| BL11 | 11  |     |     | 59  | 75  | 91  | 107 |     |       | 5  |
| BL12 |     | 28  | 44  |     |     |     |     | 124 | 12    | 4  |
| BL13 | 13  |     |     | 61  | 77  | 93  | 109 |     |       | 5  |
| BL14 |     | 30  | 46  |     |     |     |     | 126 | 14    | 4  |
| BL15 | 15  |     |     | 63  | 79  | 95  | 111 |     |       | 5  |

Table 3 shows the bits of the second data DATA_B<0:127> and the bits of the DBI flag DBI_C<0:15> that are required to generate PARITY_C0 according to the rule defined in the Hamming Code.

However, the second data DATA_B<0:127> required to generate the PARITY_C0 does not necessarily mean that the second data DATA_B<0:127> is used herein, but should be understood as a means for explaining the data structure.

In order for the parity regenerator 450 to generate the third parity PARITY_C<0:8> for the third data DATA_C<0:127> out of the second parity PARITY_B<0:8>, odd/even number information of 1 (logic high level) of the bits of the second data DATA_B<0:127> and the bits of the DBI flag DBI_C<0:15> that are required to generate the PARITY_C0 is required as the DBI is applied. The phrase odd/even number information of 1 refers to whether the number of bits in the specified data is an odd number or an even number. The third data DATA_C<0:127> is data that the DBI is applied. The second data DATA_B<0:127> is data that the DBI is not applied.

The odd/even number information may include DBI flag bits DBI_C# to be used for generating the third parity PARITY_C0, and information on the number of the bits to be used for generating the third parity PARITY_C0 among data bits that respectively correspond to the DBI flag bits.

As described with reference to Table 2, it may be assumed that the DBI_C0 has a logic low level before the DBI is applied.

To be specific, referring to BL0 of Table 3, the bits corresponding to BL0 may be DATA_B0, DATA_B32, DATA_B48, and DBI_C0. That is, the number of the bits corresponding to the BL0 is an even number. Since the DBI_C0 is assumed to have a logic low level before the DBI signal is applied, when the DATA_B0, DATA_B32, and DATA_B48 are all 1, the number of bits of value '1' among the bits corresponding to the BL0 is an odd number.

When the DBI is applied and the DBI_C0 is 1, the DATA_B0, DATA_B32, and DATA_B48 are all inverted to '0'. In other words, the DATA_B0, DATA_B32, and DATA_B48 are 0, and the DBI_C0 is 1. Thus, the number of 1 value bits among the bits corresponding to the BL0 is still an odd number.

As another example of the BL0, when the DATA_B0 and DATA_B32 are 1 and the DATA_B48 is 0 before the DBI is applied, the number of 1 value bits among the bits corresponding to the BL0 is an even number.

Herein, when DBI is applied and the DBI_C0 is 1, the DATA_B0, DATA_B32, and DATA_B48 are all inverted. In other words, since the DATA_B and DATA_B32 are 0 and the DATA_B48 is 1 and the DBI_C0 is 1, the number of 1 value bits among the bits corresponding to the BL0 is still an even number.

Referring to BL2 of Table 3, the bits corresponding to the BL2 may be DATA_B34, DATA_B50, and DBI_C2. In other words, the number of the bits corresponding to the BL2 is an odd number.

When the DATA_B34 and DATA_B50 are both 1 before DBI is applied, the number of 1 value bits among the bits corresponding to the BL2 is an even number.

When the DBI is applied and the DBI_C2 is 1, the DATA_B34 and DATA_B50 may be all inverted to 0. In other words, since the DATA_B34 and DATA_B50 are 0 and the DBI_C0 is 1, the number of 1 value bits among the bits corresponding to the BL0 is changed to an odd number.

As another example of the BL2, the DATA_B34 is 1 before the DBI is applied and the DATA_B50 is 0, so the number of 1 value bits among the bits corresponding to the BL2 is an odd number.

When the DBI is applied and the DBI_C2 is 1, the DATA_B34 and DATA_B50 may be all inverted. In other words, since the DATA_B34 is 0 and the DATA_B50 is 1 and the DBI_C2 is 1, the number of 1 value bits among the bits corresponding to the BL2 is changed to an even number.

Therefore, referring to Table 3, when the number of bits corresponding to each of the BL0 to BL15 is an odd number, and when the bits of the DBI flag DBI_C<0:15> respectively corresponding to the BL0 to BL15 are 1, the odd/even number information of the number of 1 among the bits of the BL corresponding to the DBI flag DBI_C<0:15> may be changed. In other words, since the number of the bits corresponding to the BL2 is three, which is an odd number, if the DBI_C2 is 1, the odd/even number information of the number of 1 among the bits corresponding to the BL2 may be changed. On the other hand, since the number of the bits corresponding to the BL0 is four, which is an even number, even if the DBI_C0 is 1, the odd/even number information of the number of 1 among the bits corresponding to the BL0 may not be changed.

Therefore, the PARITY_C0 may include the result of performing an XOR operation onto the PARITY_B0, DBI_C2, DBI_C5, DBI_C7, DBI_C8, DBI_C9, DBI_C10, DBI_C11, DBI_C13 and DBI_C15. In other words, in order to generate the PARITY_C0, the XOR operation has to be performed on a total of 76 data bits, which are the DATA_C0, DATA_C1, DATA_C3, . . . , DATA_C126, DBI_C0, . . . DBI_C14 in the above-described memory system. However, with the parity regenerator 450, the XOR operation may have to be performed on a total of 10 data bits, which are PARITY_B0, DBI_C2, DBI_C5, DBI_C7, DBI_C8, DBI_C9, DBI_C10, DBI_C11, DBI_C13 and DBI_C15. With the same principle, the PARITY_C1 to PARITY_C7 may also be generated.

In other words, in the DATA_B# and the DBI_C# that are used to generate the PARITY_C#, the DBI_C# corresponding to the BL# which satisfies the condition that the number of summing the DATA_B# and the DBI_C# corresponding to each BL# may be said to be compressed information capable of generating the PARITY_C#.

Accordingly, in a read operation of the memory 100, the third parity PARITY_C<0:8> may be generated with less data, and the third parity PARITY_C<0:8> may be generated through a parallel processing operation, which may lead to improved processing speed of the overall operation.

Figure 4B:
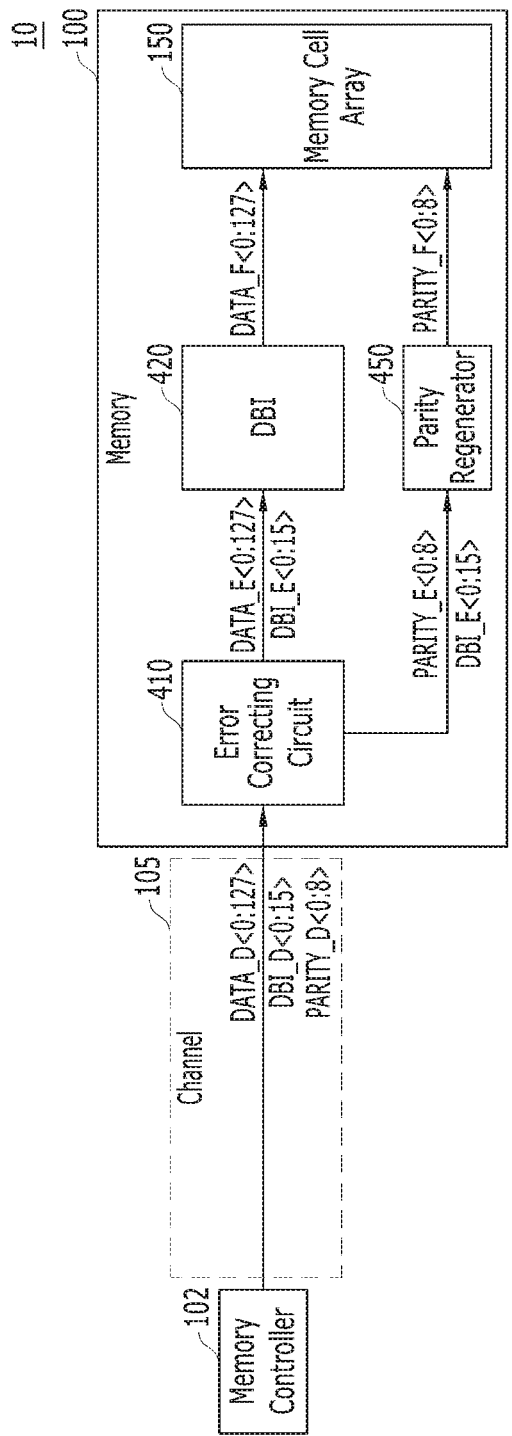

FIG. 4B illustrates a memory system 10 in accordance with an embodiment of the present invention. Referring to FIG. 4B, the memory system 10 may include a memory 100 and a memory controller 102. The memory 100 may include the error correcting circuit 410, the DBI circuit 420 and the parity regenerator 450 in a write operation of a memory system 10.

The memory controller 102 may transfer a first data DATA_D<0:127>, a first DBI flag DBI_D<0:15>, and a first parity PARITY_D<0:8> to the memory 100 through a channel 105. While the memory controller 102 transfers the first data DATA_D<0:127>, the first DBI flag DBI_D<0:15>, and the first parity PARITY_D<0:8> to the memory 100 through the channel 105, an error may occur in the first data DATA_D<0:127>, the first DBI flag DBI_D<0:15>, and/or the first parity PARITY_D<0:8>.

The error correcting circuit 410 may generate a second data DATA_E<0:127> and a second DBI flag DBI_E<0:15>. The second data DATA_E<0:127> and the second DBI flag DBI_E<0:15> may be generated by correcting the error of the first data DATA_D<0:127> and the first DBI flag DBI_D<0:15> based on the first parity PARITY_D<0:8>. The first parity PARITY_D<0:8> is for the SECDED of the first data DATA_D<0:127> and the first DBI flag DBI_D<0:15>.

Also, the error correcting circuit 410 may generate a second parity PARITY_E<0:8>, which is for the SECDED of the second data DATA_E<0:127> and the second DBI flag DBI_E<0:15>.

The DBI circuit 420 may receive the second data DATA_E<0:127> and the second DBI flag DBI_E<0:15>, and generate the third data DATA_F<0:127>. The third data DATA_F<0:127> may be generated by deciding whether the bits of the second data DATA_E<0:127> are inverted or not based on the second DBI flag DBI_E<0:15> having the inversion information of the second data DATA_E<0:127>.

The parity regenerator 450 may receive the second parity PARITY_E<0:8> and the second DBI flag DBI_E<0:15> and generate the third parity PARITY_F<0:8>. The third parity PARITY_F<0:8> is a parity for the third data DATA_F<0:127>. The generating method of the parity regenerator 450 is the same as what is described above with reference to FIG. 4A and Table 3.

Accordingly, in a write operation of the memory 100, the third parity PARITY_F<0:8> may be generated with less data, and the third parity PARITY_F<0:8> may be generated through a parallel processing operation, which may lead to improved processing speed of the overall operation.

According to embodiments of the present invention, the memory system may be provided with a core error correcting circuit and a link error correcting circuit so as to correct an error of data stored in memory cells while simultaneously providing improved error correcting performance for errors occurring in a channel.

According to embodiments of the present invention, the memory system may include an error correcting circuit capable of performing both the operation of the core error correcting circuit and the operation of the link error correcting circuit so as to reduce the latency of the error correcting operation and the power consumption.

According to embodiments of the present invention, the memory system may include a core error correcting circuit, a link error correcting circuit, and a DBI circuit together to provide improved error correcting performance through the core error correcting circuit and the link error correcting circuit, while reducing the power consumption of the memory system through the DBI circuit at the same time.

According to embodiments of the present invention, the area of the memory system may be reduced by using an error correcting circuit having a single parity generator.

While the present invention has been described with respect to specific embodiments, it will be apparent to those skilled in the art in light of the present disclosure that various changes and modifications may be made without departing from the spirit and scope of the invention as defined in the following claims.

What is claimed is:

1. A memory system, comprising:
   a memory cell array suitable for storing first data and a first parity, which is used to correct an error of the first data; and
   an error correcting circuit suitable for generating second data and a second parity, which includes bits obtained by correcting an error of the first parity and a bit obtained by correcting an error of a second sub-parity;
   wherein the error correcting circuit includes:
   a single error correction and double error detection (SECDED) parity generator suitable for generating a second pre-parity, which includes a first sub-parity and the second sub-parity;
   a syndrome decoder suitable for generating a first parity error flag and a first data error flag by decoding a syndrome;
   a SEC parity corrector suitable for correcting an error of the first parity based on the first parity error flag;
   a DED parity error detector suitable for generating a second sub-parity error flag based on an error information of the first data used to generate the second sub-parity;
   a DED parity corrector suitable for correcting any error of the second sub-parity based on the second sub-parity error flag; and
   a syndrome generator suitable for receiving the first data, the first parity and the first sub-parity and performing an XOR operation on the first data, the first parity and the first sub-parity according to a Hamming Code to generate the syndrome,
   wherein the syndrome includes information obtained by encoding error position information of the first data.

2. The memory system of claim 1, wherein the error correcting circuit further includes:
   a data corrector suitable for generating the second data by correcting an error of the first data.

3. The memory system of claim 1,
   wherein the first parity error flag represents an error position information of the first parity, and
   wherein the first data error flag represents an error position information of the first data.

4. The memory system of claim 1,
   wherein the SECDED parity generator performs an XOR operation on data bits selected among the first data according to the Hamming Code.

5. The memory system of claim 1,
   wherein the second sub-parity error flag represents an error existence information of the second sub-parity.

6. The memory system of claim 1,
   wherein the DED parity error detector detects an error of the second sub-parity by performing an OR gating operation on bits of the first data used to generate the second sub-parity.

7. The memory system of claim 1,
wherein the DED parity corrector outputs the second sub-parity without change, when the second sub-parity error flag has a logic low level, and
when the second sub-parity error flag has a logic high level, the DED parity corrector inverts the second sub-parity and outputs the inverted bits of the second sub-parity.

8. The memory system of claim 2,
wherein the data corrector outputs a first data bit corresponding to a first data error flag bit among the bits of the first data without change, when the first data error flag bit among the bits of the first data error flag has a logic low level, and
when the first data error flag bit has a logic high level, the data corrector inverts the first data bit and outputs the inverted first data bit.

9. The memory system of claim 1,
wherein the SEC parity corrector outputs a first parity bit corresponding to a first parity error or flag bit among the bits of the first parity without change, when the first parity error flag bit among the bits of the first parity error flag has a logic low level, and
when the first parity error flag bit has a logic high level, the SEC parity corrector inverts the first parity bit and outputs the inverted first parity bit.

10. The memory system of claim 1, further comprising:
a data bus inversion (DBI) circuit suitable for generating a DBI flag and generating a third data by using the DBI flag; and
a parity regenerator suitable for generating a third parity by transforming the second parity according to odd/even number information, by using the DBI flag.

11. The memory system of claim 10,
wherein the DBI circuit inverts bits of the second data, which are included in sets corresponding to each bit of the DBI flag having a logic high level.

12. The memory system of claim 11,
wherein each bit of the DBI flag indicates the logic high level when number of the second data bits included in the sets corresponding to each bit of the DBI flag, is equal to or greater than a predetermined threshold value.

13. The memory system of claim 10,
wherein parity regenerator performs an XOR operation on the bits of the DBI flag corresponding to the odd/even number information indicating an odd number, and the second parity.

14. The memory system of claim 10,
wherein the odd/even number information indicates the odd number when number of bits of the second data, which is related to generation of the third parity, having a logic high level, is odd.

15. A method for operating a memory system, comprising:
generating second data and a second parity, which includes bits obtained by correcting an error of a first parity and a bit obtained by correcting an error of a second sub-parity,
wherein the generating the second data and the second parity comprises:
generating a second pre-parity, which includes a first sub-parity and the second sub-parity using first data stored in a memory cell array;
performing an XOR operation on first data, the first parity and the first sub-parity according to a Hamming Code to generate a syndrome;
generating a first parity error flag and a first data error flag by decoding a syndrome;
correcting an error of the first parity based on the first parity error flag;
generating a second sub-parity error flag based on an error information of the first data used to generate the second sub-parity; and
correcting any error of the second sub-parity based on the second sub-parity error flag,
wherein the syndrome includes information obtained by encoding error position information of the first data.

16. The method of claim 15, further comprising:
generating the second data by correcting an error of the first data.

17. The method of claim 15,
wherein the first parity error flag represents an error position information of the first parity, and
wherein the first data error flag represents an error position information of the first data.

18. The method of claim 15,
wherein the generating the second pre-parity comprises performing an XOR operation on data bits selected among the first data according to the Hamming Code.

19. The method of claim 15,
wherein the second sub-parity error flag represents an error existence information of the second sub-parity.

20. The method of claim 15,
wherein the generating the second sub-parity error flag comprises detecting an error of the second sub-parity by performing an OR gating operation on bits of the first data used to generate the second sub-parity.

21. The method of claim 15,
wherein the correcting of any error of the second sub-parity comprises:
outputting a second sub-parity bit without change, when the second sub-parity error flag has a logic low level, and
inverting the second sub-parity bit and outputting the inverted second sub-parity bit, when the second sub-parity error flag has a logic high level.

22. The method of claim 16,
wherein the generating the second data comprises:
outputting a first data bit corresponding to the first data error flag bit among the bits of the first data without change, when the first data error flag bit among the bits of the first data error or flag has a logic low level, and
inverting the first data bit and outputting the inverted first data bit, when the first data error or flag bit has a logic high level.

23. The method of claim 15,
wherein the correcting the error of the first parity comprises:
outputting a first parity bit corresponding to a first parity error flag bit among the bits of the first parity without change, when the first parity error flag bit among the bits of the first parity error flag has a logic low level, and
inverting the first parity bit and outputting the inverted first parity bit, when the first parity error flag bit has a logic high level.

24. The method of claim 15, further comprising:
generating a DBI flag;
generating a third data by using the DBI flag; and
generating a third parity by transforming the second parity according to odd/even number information, by using the DBI flag.

25. The method of claim 24,
wherein the generating the third data comprises inverting bits of the second data, which are included in sets corresponding to each bit of the DBI flag having a logic high level.

26. The method of claim 25,
wherein each bit of the DBI flag indicates the logic high level when number of the second data bits included in the sets corresponding to each bit of the DBI flag, is equal to or greater than a predetermined threshold value.

27. The method of claim 24,
wherein the generating the third parity comprises performing an XOR operation on the bits of the DBI flag corresponding to the odd/even number information indicating an odd number, and the second parity.

28. The method of claim 24,
wherein the odd/even number information indicates the odd number when number of bits of the second data, which is related to generation of the third parity, having a logic high level, is odd.

\* \* \* \* \*